(12) United States Patent
Tian et al.

(10) Patent No.: US 9,451,705 B2
(45) Date of Patent: Sep. 20, 2016

(54) TOUCH PANEL AND PRODUCTION METHOD THEREOF

(71) Applicant: Huawei Device Co., Ltd., Shenzhen (CN)

(72) Inventors: Xingfa Tian, Shenzhen (CN); Zengcai Sun, Wuhan (CN); Zhu Liu, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 22 days.

(21) Appl. No.: 14/569,004

(22) Filed: Dec. 12, 2014

(65) Prior Publication Data

US 2015/0109249 A1 Apr. 23, 2015

Related U.S. Application Data

(63) Continuation of application No. PCT/CN2013/085600, filed on Oct. 21, 2013.

(51) Int. Cl.
*G06F 3/044* (2006.01)
*H05K 3/10* (2006.01)

(52) U.S. Cl.
CPC ................ *H05K 3/10* (2013.01); *G06F 3/044* (2013.01); *G06F 2203/04103* (2013.01); *G06F 2203/04111* (2013.01); *H03K 2217/960755* (2013.01); *Y10T 29/49162* (2015.01)

(58) Field of Classification Search
CPC .................... G06F 3/044; G06F 2203/4103
See application file for complete search history.

(56) References Cited

U.S. PATENT DOCUMENTS

| 2008/0158181 | A1 | 7/2008 | Hamblin et al. |
| 2008/0158183 | A1 | 7/2008 | Hotelling et al. |
| 2008/0309635 | A1 | 12/2008 | Matsuo |
| 2009/0266621 | A1 | 10/2009 | Huang et al. |
| 2011/0012845 | A1 | 1/2011 | Rothkopf et al. |
| 2011/0099805 | A1* | 5/2011 | Lee .......................... G06F 3/044 29/846 |

(Continued)

FOREIGN PATENT DOCUMENTS

| CN | 101311890 A | 11/2008 |
| CN | 101324827 A | 12/2008 |
| CN | 101533325 A | 9/2009 |
| CN | 102346587 A | 2/2012 |

(Continued)

OTHER PUBLICATIONS

Foreign Communication From a Counterpart Application, PCT Application No. PCT/CN2013/085600, International Search Report dated Jul. 25, 2014, 7 pages.

(Continued)

*Primary Examiner* — Larry Sternbane
(74) *Attorney, Agent, or Firm* — Conley Rose, P.C.; Grant Rodolph (57) ABSTRACT

A touch panel that includes a substrate, a first conductive layer, a second conductive layer, and FPCs including a first FPC and a second FPC, the first FPC is connected to the first conductive layer, the second FPC is connected to the second conductive layer; the first conductive layer includes n rows of first conductive patterns, one end of each row is connected to one end of a first metal wire, the other end of the first metal wire is connected to the first FPC; the second conductive layer includes m columns of second conductive patterns, one end of each column is connected to one end of a second metal wire, the other end of the second metal wire is connected to the second FPC.

20 Claims, 7 Drawing Sheets

(56) References Cited

U.S. PATENT DOCUMENTS

| | | | |
|---|---|---|---|
| 2011/0148811 A1 | 6/2011 | Kanehira et al. | |
| 2012/0170283 A1 | 7/2012 | Kobayashi et al. | |
| 2012/0247938 A1 | 10/2012 | Saito et al. | |
| 2013/0241874 A1* | 9/2013 | Long | G06F 3/0418 345/174 |
| 2013/0248228 A1 | 9/2013 | Liu et al. | |
| 2013/0271384 A1 | 10/2013 | Chuang et al. | |
| 2014/0139761 A1* | 5/2014 | Yanagawa | G06F 3/044 349/12 |

FOREIGN PATENT DOCUMENTS

| | | |
|---|---|---|
| CN | 102667688 A | 9/2012 |
| CN | 103327729 A | 9/2013 |
| JP | 2012079169 A | 4/2012 |
| JP | 20120208732 A | 10/2012 |
| WO | 2013014883 A1 | 1/2013 |

OTHER PUBLICATIONS

Foreign Communication From a Counterpart Application, PCT Application No. PCT/CN2013/085600, Written Opinion dated Jul. 25, 2014, 5 pages.

Foreign Communication From a Counterpart Application, European Application No. 13886625.6, Extended European Search Report dated Aug. 21, 2015, 7 pages.

Partial English Translation and Abstract of Japanese Patent Application No. JPA2012208732, Apr. 11, 2016, 33 pages.

Shiozawa, N., et al., "Trend of Paste Material," New Touch Panel Practical Course, Japan, Technotimes Corporation, Apr. 13, 2011, pp. 167-170.

Foreign Communication From a Counterpart Application, Chinese Application No. 2015-543266, Chinese Office Action dated Jan. 26, 2016, 5 pages.

Foreign Communication From a Counterpart Application, Chinese Application No. 2015-543266, English Translation of Chinese Office Action dated Jan. 26, 2016, 6 pages.

Partial English Translation and Abstract of Japanese Patent Application No. JPA2012079169, Jul. 22, 2016, 27 pages.

Foreign Communication From a Counterpart Application, Japanese Application No. 2015-543266, Japanese Notice of Rejection dated Jun. 14, 2016, 5 pages.

Foreign Communication From a Counterpart Application, Japanese Application No. 2015-543266, English Translation of Japanese Notice of Rejection dated Jun. 14, 2016, 7 pages.

* cited by examiner

TOUCH PANEL AND PRODUCTION METHOD THEREOF

CROSS-REFERENCE TO RELATED APPLICATIONS

This application is a continuation of International Application No. PCT/CN2013/085600, filed on Oct. 21, 2013, which is hereby incorporated by reference in its entirety.

TECHNICAL FIELD

The present invention relates to the field of touchscreens, and in particular, to a touch panel and a production method thereof.

BACKGROUND

With growing user demands for interaction efficiency of terminals, an efficient touch interaction manner has become a prevalent interaction manner. The operation complexity of a terminal can be reduced by installing a touchscreen including a touch panel onto the terminal. As the key of the touchscreen lies in the touch panel, production of the touch panel becomes the focus of people's attention.

In the prior art, a touch panel is provided, including a substrate, row and column Indium Tin Oxides (ITO) traces that are formed on two surfaces of the substrate, and a Flexible Printed Circuit (FPC). The FPC includes a first FPC and a second FPC that are directly opposite to each other. The row ITO traces are connected to the first FPC, the column ITO traces are connected to the second FPC, and the first FPC and the second FPC are respectively connected to the two surfaces of the substrate. Being directly opposite means that a projection, of a first connection region of the first FPC on a first surface, on a second surface, completely overlaps with a second connection region of the second FPC on the second surface, where the first surface is a surface on which the row ITO traces are located, and the second surface is a surface on which the column ITO traces are located.

Because the row ITO traces are directly connected to the FPC, a length of the first FPC in a direction of the column ITO traces is greater than or equal to a perpendicular distance between a $1^{st}$ row ITO trace and an $n^{th}$ row ITO trace. As a result, the FPC is relatively long. Because an area of the FPC is directly proportional to the length of the FPC, the area of the FPC in a conventional touch panel is large, resulting in a high production cost of the touch panel.

SUMMARY

To solve the problem of a high cost of a touch panel caused by a large area of an FPC, embodiments of the present invention provide a touch panel and a production method thereof.

According to a first aspect, an embodiment of the present invention provides a touch panel, where the touch panel includes a substrate, a first conductive layer formed on an upper surface of the substrate, a second conductive layer formed on a lower surface of the substrate, and FPCs, where the FPCs include a first FPC and a second FPC, the first FPC is connected to the first conductive layer, and the second FPC is connected to the second conductive layer; the first conductive layer includes n rows of first conductive patterns that are arranged in a first direction, one end of each row is connected to one end of a first metal wire, and the other end of the first metal wire is connected to the first FPC; the second conductive layer includes m columns of second conductive patterns that are arranged in a second direction, one end of each column is connected to one end of a second metal wire, the other end of the second metal wire is connected to the second FPC, and the second conductive pattern and the first conductive pattern are used to generate a coupling capacitance; and a ray in the first direction is perpendicular to a ray in the second direction, and a length of the first FPC in the second direction is less than a perpendicular distance between a $1^{st}$ row and an $n^{th}$ row.

In a first possible implementation manner of the first aspect, if the first conductive pattern is formed by at least two first preset patterns, adjacent first preset patterns in a row are connected; and if the second conductive pattern is formed by at least two second preset patterns, adjacent second preset patterns in a column are connected.

With reference to the first possible implementation manner of the first aspect, in a second possible implementation manner of the first aspect, the first preset patterns and the second preset patterns are determined by a required coupling capacitance between the first conductive layer and the second conductive layer.

With reference to the first aspect, the first possible implementation manner of the first aspect, or the second possible implementation manner of the first aspect, in a third possible implementation manner of the first aspect, a row width of each row is equal, a column width of each column is equal, and the row width is equal to the column width.

In a fourth possible implementation manner of the first aspect, the touch panel further includes a touch control chip and a peripheral circuit that are connected to each of the first FPC and the second FPC.

With reference to the fourth possible implementation manner of the first aspect, in a fifth possible implementation manner of the first aspect, the first FPC is connected to a drive pin of the touch control chip, and the second FPC is connected to a receiving pin of the touch control chip; or the first FPC is connected to a receiving pin of the touch control chip, and the second FPC is connected to a drive pin of the touch control chip, where the drive pin is used to send a drive signal, and the receiving pin is used to receive a received signal that is fed back according to the drive signal.

According to a second aspect, an embodiment of the present invention provides a touch panel production method, where the method includes forming a first conductive layer on an upper surface of a substrate, etching n rows of first conductive patterns on the first conductive layer in a first direction, connecting one end of each row to one end of a first metal wire, connecting the other end of the first metal wire to a first FPC of FPCs, and connecting the first FPC to the first conductive layer; and forming a second conductive layer on a lower surface of the substrate, etching m columns of second conductive patterns on the second conductive layer in a second direction, connecting one end of each column to one end of a second metal wire, connecting the other end of the second metal wire to a second FPC of the FPCs, and connecting the second FPC to the second conductive layer, where the second conductive pattern and the first conductive pattern are used to generate a coupling capacitance; and a ray in the first direction is perpendicular to a ray in the second direction, and a length of the first FPC in the second direction is less than a perpendicular distance between a $1^{st}$ row and an $n^{th}$ row.

In a first possible implementation manner of the second aspect, the method further includes, if the first conductive pattern is formed by at least two first preset patterns, connecting adjacent first preset patterns in a row; and if the second conductive pattern is formed by at least two second preset patterns, connecting adjacent second preset patterns in a column.

With reference to the first possible implementation manner of the second aspect, in a second possible implementation manner of the second aspect, before the etching n rows of first conductive patterns on the first conductive layer, the method further includes determining the first preset patterns and the second preset patterns according to a required coupling capacitance between the first conductive layer and the second conductive layer.

With reference to the second aspect, the first possible implementation manner of the second aspect, or the second possible implementation manner of the second aspect, in a third possible implementation manner of the second aspect, before the etching n rows of first conductive patterns on the first conductive layer, the method further includes setting a same row width for each row, and setting a same column width for each column, where the column width is equal to the row width.

In a fourth possible implementation manner of the second aspect, the method further includes connecting a touch control chip and a peripheral circuit to each of the first FPC and the second FPC.

With reference to the fourth possible implementation manner of the second aspect, in a fifth possible implementation manner of the second aspect, the method further includes connecting the first FPC to a drive pin of the touch control chip, and connecting the second FPC to a receiving pin of the touch control chip; or connecting the first FPC to a receiving pin of the touch control chip, and connecting the second FPC to a drive pin of the touch control chip, where the drive pin is used to send a drive signal, and the receiving pin is used to receive a received signal that is fed back according to the drive signal.

The benefits of the technical solutions provided by the embodiments of the present invention are described as follows.

One end of each row is connected to one end of the first metal wire, and the other end of the first metal wire is connected to the first FPC, so that a length of the first FPC included in an FPC in the second direction is determined by a distance between an endpoint at the other end of a $1^{st}$ first metal wire and an endpoint at the other end of an $n^{th}$ first metal wire, the length of the first FPC in the second direction can be reduced by shortening the distance, and consequently the length of the first FPC in the second direction is less than the perpendicular distance between the $1^{st}$ row and the $n^{th}$ row, thereby solving the problem in the prior art that a large area of the FPC, which is caused by the length of the first FPC that is greater than or equal to the perpendicular distance between the $1^{st}$ row and the $n^{th}$ row, results in a high production cost of the touch panel, and achieving the effect of reducing the production cost of the touch panel.

BRIEF DESCRIPTION OF DRAWINGS

To describe the technical solutions in the embodiments of the present invention more clearly, the following briefly introduces the accompanying drawings required for describing the embodiments. The accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the present invention clearer, the following further describes the embodiments of the present invention in detail with reference to the accompanying drawings.

Figure 1:
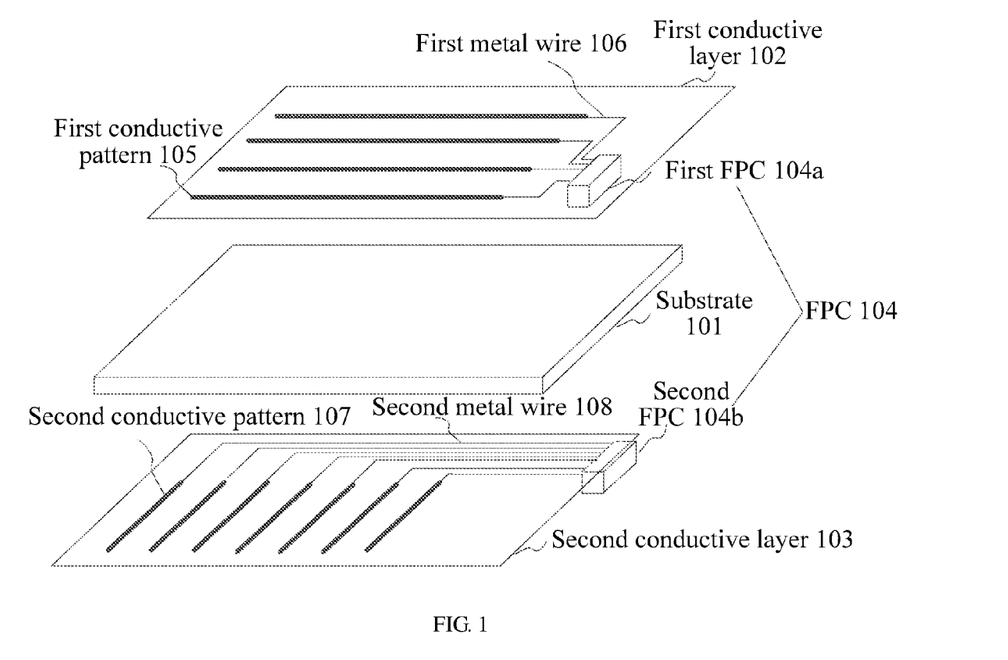
FIG. 1 is a structural framework diagram of a touch panel according to an embodiment of the present invention.

Referring to FIG. 1, FIG. 1 shows a structural framework diagram of a touch panel according to an embodiment of the present invention. The touch panel includes a substrate 101, a first conductive layer 102 formed on an upper surface of the substrate, a second conductive layer 103 formed on a lower surface of the substrate, and an FPC 104, where the FPC 104 includes a first FPC 104a and a second FPC 104b, the first FPC 104a is connected to the first conductive layer 102, and the second FPC 104b is connected to the second conductive layer 103.

The first conductive layer 102 includes n rows of first conductive patterns 105 that are arranged in a first direction, one end of each row is connected to one end of a first metal wire 106, and the other end of the first metal wire 106 is connected to the first FPC 104a, where n is greater than or equal to 2 and n is an integer.

The second conductive layer 103 includes m columns of second conductive patterns 107 that are arranged in a second direction, one end of each column is connected to one end of a second metal wire 108, and the other end of the second metal wire 108 is connected to the second FPC 104b, where the second conductive pattern and the first conductive pattern are used to generate a coupling capacitance, and m is greater than or equal to 1 and m is an integer.

A ray in the first direction is perpendicular to a ray in the second direction, and a length of the first FPC 104a in the second direction is less than a perpendicular distance between a $1^{st}$ row and an $n^{th}$ row.

In conclusion, according to the touch panel provided by the embodiment of the present invention, one end of each row is connected to one end of a first metal wire, and the other end of the first metal wire is connected to the first FPC, so that a length of the first FPC included in an FPC in a second direction is determined by a distance between an endpoint at the other end of a $1^{st}$ first metal wire and an endpoint at the other end of an $n^{th}$ first metal wire, the length of the first FPC in the second direction can be reduced by shortening the distance, and consequently the length of the first FPC in the second direction is less than a perpendicular distance between a $1^{st}$ row and an $n^{th}$ row, thereby solving the problem in the prior art that a large area of the FPC, which is caused by the length of the first FPC in the second direction that is equal to the perpendicular distance between the $1^{st}$ row and the $n^{th}$ row, results in a high production cost of the touch panel, and achieving the effect of reducing the production cost of the touch panel.

Figure 2A:
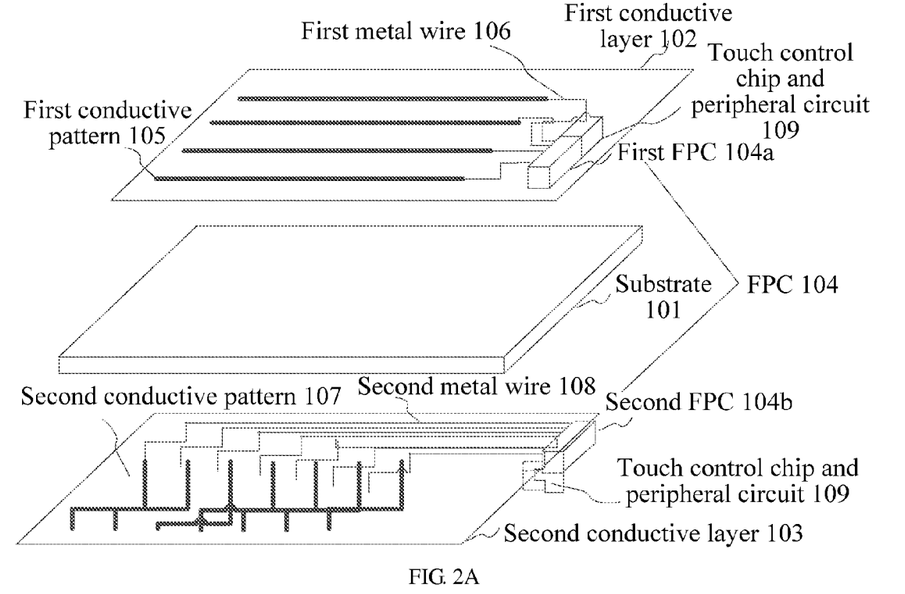
FIG. 2A is a structural framework diagram of a touch panel according to another embodiment of the present invention.

Referring to FIG. 2A, FIG. 2A shows a structural framework diagram of a touch panel according to another embodiment of the present invention. The touch panel includes a substrate 101, a first conductive layer 102 formed on an upper surface of the substrate, a second conductive layer 103 formed on a lower surface of the substrate, and an FPC 104, where the FPC 104 includes a first FPC 104a and a second FPC 104b, the first FPC 104a is connected to the first conductive layer 102, and the second FPC 104b is connected to the second conductive layer 103.

The first conductive layer 102 includes n rows of first conductive patterns 105 that are arranged in a first direction, one end of each row is connected to one end of a first metal wire 106, and the other end of the first metal wire 106 is connected to the first FPC 104a, where n is greater than or equal to 2 and n is an integer.

The second conductive layer 103 includes m columns of second conductive patterns 107 that are arranged in a second direction, one end of each column is connected to one end of a second metal wire 108, and the other end of the second metal wire 106 is connected to the second FPC 104b, where the second conductive pattern and the first conductive pattern are used to generate a coupling capacitance, and m is greater than or equal to 1 and m is an integer.

A ray in the first direction is perpendicular to a ray in the second direction, and a length of the first FPC 104a in the second direction is less than a perpendicular distance between a $1^{st}$ row and an $n^{th}$ row.

For ease of description, the "length in the second direction" in the following is abbreviated as the "length".

The substrate 101 is made of a conductive material with impedance. Generally, the substrate 101 has an impedance of 70 to 100 ohms.

The first conductive layer 102 includes the n rows of first conductive patterns 105 that are arranged in the first direction. The first conductive pattern 105 on each row may be formed by a conductive material such as ITO, and is connected to the first FPC 104a by using the first metal wire 106. One row of first conductive pattern 105 is connected to one first metal wire 106, and any two first metal wires 106 on the first conductive layer 102 do not intersect, where the first metal wires 106 may be formed by silver paste, molybdenum-aluminum-molybdenum, or the like.

The second conductive layer 103 includes the m columns of second conductive patterns 107 that are arranged in the second direction. The second conductive pattern 107 in each column may be formed by a conductive material such as ITO, and is connected to the second FPC 104b by using the second metal wire 108. One column of second conductive pattern 107 is connected to one second metal wire 108, and any two second metal wires 108 on the second conductive layer 103 do not intersect, where the second metal wires 108 may be formed by silver paste, molybdenum-aluminum-molybdenum, or the like.

In this embodiment, each row of first conductive pattern 105 is formed by i (i is greater than or equal to 1) first preset patterns, and each column of second conductive pattern 107 is formed by j (j is greater than or equal to 1) second preset patterns. The first preset pattern and the second preset pattern may be patterns in any shape, for example, a rectangle, a triangle, a circle, a rhombus, a hexagon, or an irregular pattern, and the first preset pattern and the second preset pattern may be the same, and may not be the same.

Because the first conductive pattern 105 and the second conductive pattern 107 are formed by a conductive material, when a current passes through the first conductive pattern 105 or the second conductive pattern 107, a coupling capacitance is generated between the first conductive pattern 105 and the second conductive pattern 107. Because a value of the coupling capacitance is directly proportional to a coupling area of a conductive pattern, and is inversely proportional to a coupling distance of the conductive pattern, after a value of a required coupling capacitance is determined, the first preset pattern and the second preset pattern can be determined according to the coupling area and the coupling distance. In other words, the first preset pattern and the second preset pattern are determined by the required coupling capacitance between the first conductive layer 102 and the second conductive layer 103.

This embodiment is described by using an example in which the first preset pattern and the second preset pattern are rhombuses. Referring to a schematic top view of an arrangement of conductive patterns shown in FIG. 2B, the first preset pattern and a connection thereof are represented by solid lines, and the second preset pattern and a connection thereof are represented by dashed lines. An edge a on a lower left side of the first preset pattern is adjacent to an edge b on an upper right side of the second preset pattern; therefore, a coupling capacitance is generated between the edge a of the first preset pattern and the edge b of the second preset pattern. When the required coupling capacitance that needs to be generated is high, edge lengths of the edge a and the edge b may be increased to increase a coupling area, or a perpendicular distance between the edge a and the edge b may be reduced to reduce a coupling distance. When the required coupling capacitance is low, the edge lengths of the edge a and the edge b may be reduced to reduce the coupling area, or the perpendicular distance between the edge a and the edge b may be increased to increase the coupling distance.

After the first preset pattern and the second preset pattern are determined according to the required coupling capacitance, the first preset patterns need to be connected to form n rows on the first conductive layer 102, where each row may be the first conductive patterns 105; and the second preset patterns are connected to form m columns on the second conductive layer 103, where each column may be the second conductive patterns 107. A projection of each row of first conductive pattern 105 on the second conductive layer 103 may partially or completely overlap with, and may also not overlap with each column of second conductive pattern 107. For example, in FIG. 2B, a projection of any row of first conductive pattern 105 on the second conductive layer 103 does not overlap with any second conductive pattern 107.

Figure 2B:
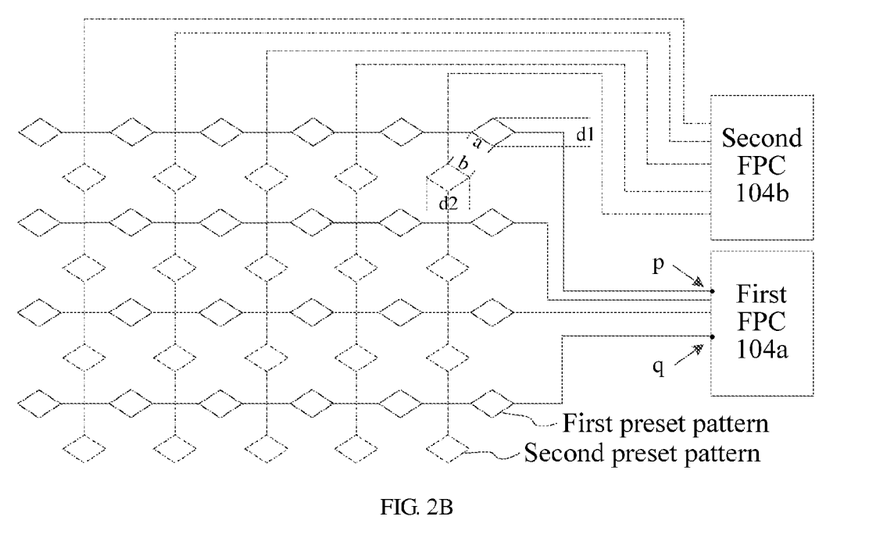
FIG. 2B is a schematic top view of an arrangement of conductive patterns according to an embodiment of the present invention.

When at least two first preset patterns are connected to form one row, in order to ensure conductivity of the first conductive pattern 105 that is formed after the connection to form one row, adjacent first preset patterns in a row may be connected. Similarly, adjacent second preset patterns in a column may be connected. For example, adjacent rhombuses are connected by using a conductive rectangle connection block or a conductive wire. In FIG. 2B, the conductive wire is used as an example for representation.

In this embodiment, a row width of each row may be equal, and a column width of each column may be equal. The row width of each row may further be set to a first numeric value, and the column width of each column may be set to a second numeric value. When the first conductive pattern 105 is different from the second conductive pattern 107, the first numeric value and the second numeric value may further be set to further determine a relationship between the row width and the column width.

For example, if the second numeric value is set to be less than the first numeric value, the row width is greater than the column width; or if the second numeric value is set to be greater than the first numeric value, the row width is less than the column width; or if the second numeric value is set to be equal to the first numeric value, the row width is equal to the column width. When the row width is equal to the column width, a balance is achieved between a self-capacitance generated between one row of first conductive pattern 105 and the ground and a coupling capacitance generated between the row of first conductive pattern 105 and each column of second conductive pattern 107, so that time of responding to a touch operation can be shortened, and accuracy and sensitivity of responding to the touch operation can be improved.

Referring to d1 in FIG. 2B, the row width may be a maximum distance of a projection of the first conductive pattern 105 on the second conductive layer 103 in the second direction. Referring to d2 in FIG. 2B, the column width may be a maximum distance of a projection of the second conductive pattern 107 on the first conductive layer 102 in the first direction.

After each row of first conductive pattern 105 on the first conductive layer 102 and each column of second conductive pattern 107 on the second conductive layer 103 are determined, each row of first conductive pattern 105 needs to be separately connected to the first FPC 104a, and each column of second conductive pattern 107 needs to be separately connected to the second FPC 104b. This embodiment is described in detail by using an example in which one row of first conductive pattern 105 is connected to the first FPC 104a. If the row of first conductive pattern 105 is formed by one first preset pattern, because each preset pattern includes a port for connection, one end of the first preset pattern may be directly connected to the first FPC 104a by using the first metal wire 106. If the row of first conductive pattern 105 is formed by at least two first preset patterns, because each preset pattern includes a port for connection, the at least two first preset patterns may be connected according to ports to form a row in the first direction, and one end of any first preset pattern at the beginning or the end of the row formed by connection is connected to the first FPC 104a by using the first metal wire 106.

Figure 2C:
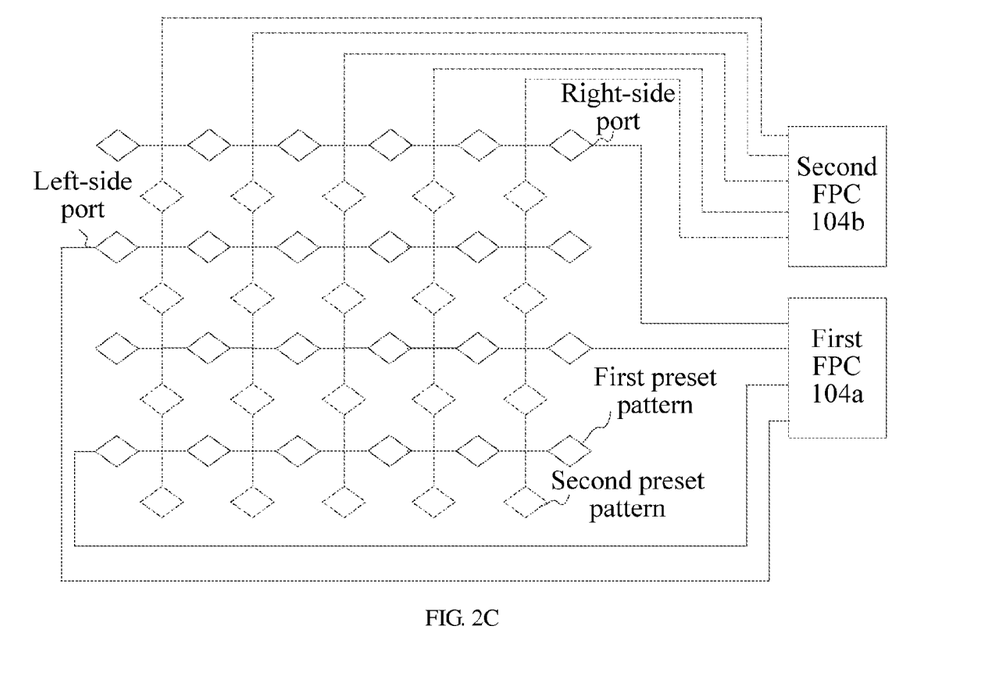
FIG. 2C is a schematic top view of a first connection manner of conductive patterns according to an embodiment of the present invention.

Because there are at least two rows of first conductive patterns 105, ports of the rows of first conductive patterns 105, which are on a same side, are separately connected to the first FPC 104a. For example, referring to a connection manner of conductive patterns shown in FIG. 2B, right-side ports of all rows of first conductive patterns 105 are separately connected to the first FPC 104a. Ports of all rows of first conductive patterns 105, which are on different sides, may also be connected to the first FPC 104a. For example, referring to a schematic top view of a first connection manner of conductive patterns shown in FIG. 2C, right-side ports of k (k≥1) rows of first conductive patterns 105 and left-side ports of remaining (n−k) rows of first conductive patterns 105 are separately connected to the first FPC 104a. Referring to FIG. 2C, a right-side port of the first conductive pattern 105 is a right-side port of a first preset pattern arranged on the rightmost side, and a left-side port of the first conductive pattern 105 is a left-side port of a first preset pattern arranged on the leftmost side.

Preferably, a right-side port and a left-side port of each row of first conductive pattern 105 may further be separately connected to the first FPC 104a by using two first metal wires 106. A current is shunted by using the two first metal wires 106; therefore, a speed of detecting the current can be increased, time of responding to a touch is shortened, and the touch effect is improved. Similarly, an upper-side port and a lower-side port of the second conductive pattern 107 may be separately connected to the second FPC 104b by using two second metal wires 108.

Figure 2D:
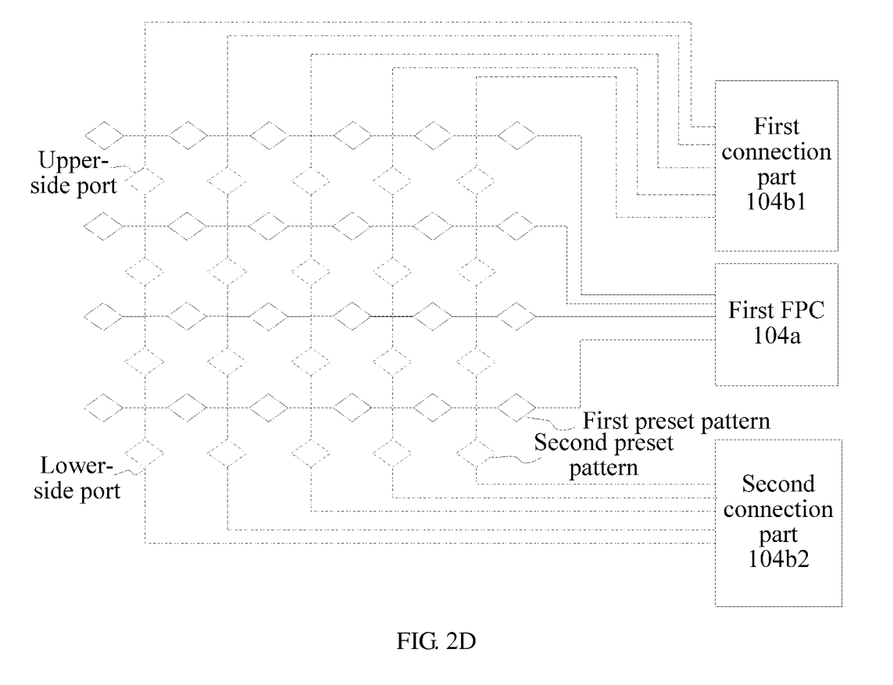
FIG. 2D is a schematic top view of a second connection manner of conductive patterns according to an embodiment of the present invention.

Referring to a schematic top view of a second connection manner of conductive patterns shown in FIG. 2D, this embodiment is described by using an example in which an upper-side port and a lower-side port of the second conductive pattern 107 are separately connected to the second FPC 104b by using two second metal wires 108. In FIG. 2D, the second FPC 104b is divided into a first connection part 104b1 and a second connection part 104b2, where the first connection part 104b1 is connected to the upper-side port of the second conductive pattern 107, and the second connection part 104b2 is connected to the lower-side port of the second conductive pattern 107. Referring to FIG. 2D, the upper-side port of the second conductive pattern 107 is an upper-side port of a second preset pattern arranged on the uppermost side, and the lower-side port of the second conductive pattern 107 is a lower-side port of a second preset pattern arranged on the lowermost side.

When the first metal wires 106 are connected to the first FPC 104a, a length of the first FPC 104a further needs to be determined, so that the first FPC 104a whose length is determined is connected to the first conductive layer 102. Because the first FPC 104a is connected to the first metal wires 106, the length of the first FPC 104a is determined by a distance between an endpoint at the other end of a $1^{st}$ first metal wire 106 and a port at the other end of an $n^{th}$ first metal wire 106, for example, a distance between an endpoint p at the other end of a $1^{st}$ first metal wire 106 and an endpoint q at the other end of an $n^{th}$ first metal wire 106 in FIG. 2B. The length of the first FPC 104a is reduced by shortening the distance, so that an area of the FPC can be reduced, thereby reducing a production cost of the touch panel. Similarly, a length of the second FPC 104b is also determined by a distance between an endpoint at the other end of a $1^{st}$ second metal wire 108 and a port at the other end of an $m^{th}$ second metal wire 108.

Figure 2E:
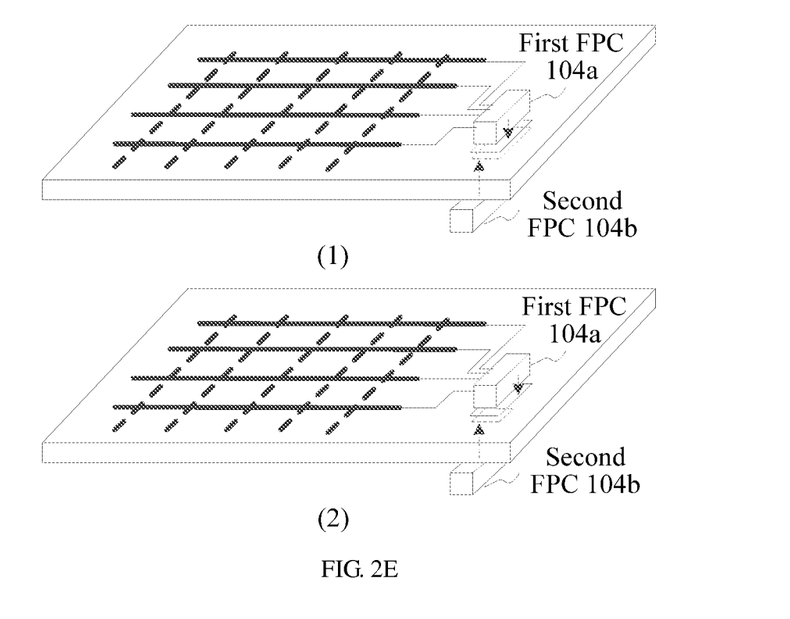
FIG. 2E is a schematic diagram showing that a first FPC is directly opposite to a second FPC according to an embodiment of the present invention.

After the length of the first FPC 104a is determined according to the first metal wires 106 and the length of the second FPC 104b is determined according to the second metal wires 108, the first FPC 104a may be set to be directly opposite to the second FPC 104b. Being directly opposite means that a projection region, of a connection region of the first FPC 104a on the first conductive layer 102, on the second conductive layer 103, completely overlaps with a connection region of the second FPC 104b on the second conductive layer 103, that is, the projection region includes or is equal to the connection region. For example, the first FPC 104a is connected to a right edge of the first conductive layer 102, and the second FPC 104b is connected to a corresponding position at a right edge of the second conductive layer 103. Referring to a schematic diagram showing that the first FPC is directly opposite to the second FPC shown in FIG. 2E, in FIG. 2E (1), an area of the projection region of the first FPC 104a is equal to that of the connection region of the second FPC 104b; and in FIG. 2E (2), the projection region of the first FPC 104a includes the connection region of the second FPC 104b.

Figure 2F:
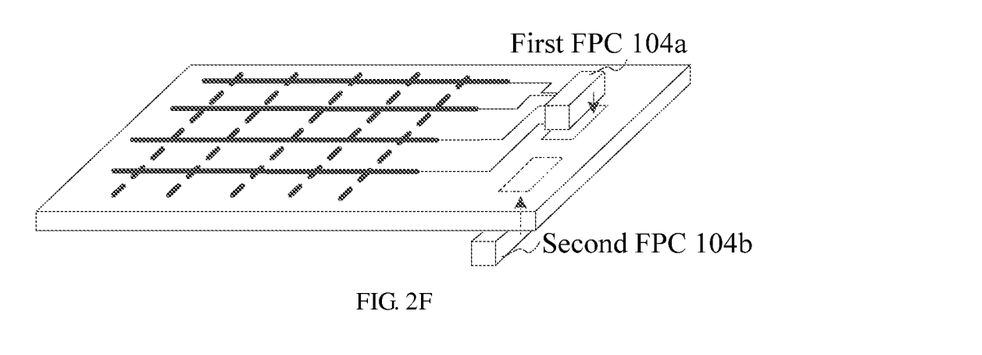
FIG. 2F is a schematic diagram showing that a first FPC is not directly opposite to a second FPC according to an embodiment of the present invention.

Because a projection, of the first metal wire 106 connected to each row of first conductive pattern 105, on the second conductive layer 103 does not intersect with the second metal wire 108 connected to each column of second conductive pattern 107, if the first FPC 104a is directly opposite to the second FPC 104b, the length of the first FPC 104a is greater than or equal to a sum of a distance between the $1^{st}$ first metal wire 106 and the $n^{th}$ first metal wire 106 on the first conductive layer 102 and a distance between the $1^{st}$ second metal wire 108 and the $m^{th}$ second metal wire 108 on the second conductive layer 103. Preferably, in order to further reduce the length of the FPC, the first FPC 104a may further be set to be not directly opposite to the second FPC 104b. In this case, the length of the first FPC 104a is equal to a perpendicular distance between the $1^{st}$ first metal wire 106 and the $n^{th}$ first metal wire 106. Refer to a schematic diagram showing that the first FPC is not directly opposite to the second FPC shown in FIG. 2F.

Referring to FIG. 2A, in this embodiment, the touch panel further includes a touch control chip and a peripheral circuit 109 that are connected to each of the first FPC 104a and the second FPC 104b.

The touch control chip is used to detect a touch operation and includes a drive pin and a receiving pin, where the drive pin is used to send a drive signal, and the receiving pin is used to receive a received signal that is fed back according to the drive signal. The peripheral circuit is used to connect the touch control chip to the FPC or an external element. The touch control chip and the peripheral circuit 109 may be located in the FPC. Alternatively, in order to further reduce the area of the FPC, the touch control chip and the peripheral circuit 109 may further be deployed on a main board, and the FPC may interact with the touch control chip by using a connection between the FPC and the main board.

When the touch control chip is separately connected to the first FPC 104a and the second FPC 104b, the first FPC 104a is connected to the drive pin of the touch control chip, and the second FPC 104b is connected to the receiving pin of the touch control chip; or the first FPC 104a is connected to the receiving pin of the touch control chip, and the second FPC 104b is connected to the drive pin of the touch control chip.

The drive pin is used to send a drive signal, and the receiving pin is used to receive a received signal that is fed back according to the drive signal.

When the first FPC 104a is connected to the drive pin and the second FPC 104b is connected to the receiving pin, the first conductive layer 102 is a drive layer, and the second conductive layer 103 is a receiving layer. When the first FPC 104a is connected to the receiving pin and the second FPC 104b is connected to the drive pin, the first conductive layer 102 is the receiving layer, and the second conductive layer 103 is the drive layer.

For ease of understanding, in this embodiment, a touch control principle is described with reference to a structure of the touch panel, and details are described as follows.

The touch control chip controls the drive pin to send a drive signal for a $1^{st}$ row to the first FPC 104a, where the drive signal may be a current signal, the first FPC 104a forwards the drive signal to the $1^{st}$ row, and a $1^{st}$ row of first conductive pattern 105 is coupled to the second conductive pattern 107 to generate a coupling capacitance. If there is no touch operation currently, each second conductive pattern 107 sends a signal coupled by the coupling capacitance to the second FPC 104b, where the signal is a received signal that is fed back according to the drive signal; and the second FPC 104b forwards the received signal to the touch control chip by using the receiving pin. The touch control chip detects each received signal; and when detecting that all received signals are the same as the drive signal, determines that an operation on the 1st row ends, and continues to perform an operation on a $2^{nd}$ row.

The touch control chip controls the drive pin to send a drive signal for the $2^{nd}$ row to the first FPC 104a, the first FPC 104a forwards the drive signal to the $2^{nd}$ row, and a $2^{nd}$ row of first conductive pattern 105 is coupled to the second conductive pattern 107 to generate a coupling capacitance. If there is a touch operation currently, because a human body and the ground form a path, one part of a signal in the first conductive pattern 105 is shunted to ground through the human body, and the other part of the signal is coupled by the coupling capacitance to the second FPC 104b, where the signal received by the second FPC 104b is a received signal that is fed back according to the drive signal, and the second FPC 104b forwards all received signals to the touch control chip by using the receiving pin. The touch control chip detects the received signals; and when detecting that a received signal is different from the drive signal, determines coordinates of the touch operation according to a column in which the receiving signal is generated and a current row, and responds to the touch operation. The touch control chip continues to perform an operation on a $3^{rd}$ row until operations on all rows are completed.

Figure 2G:
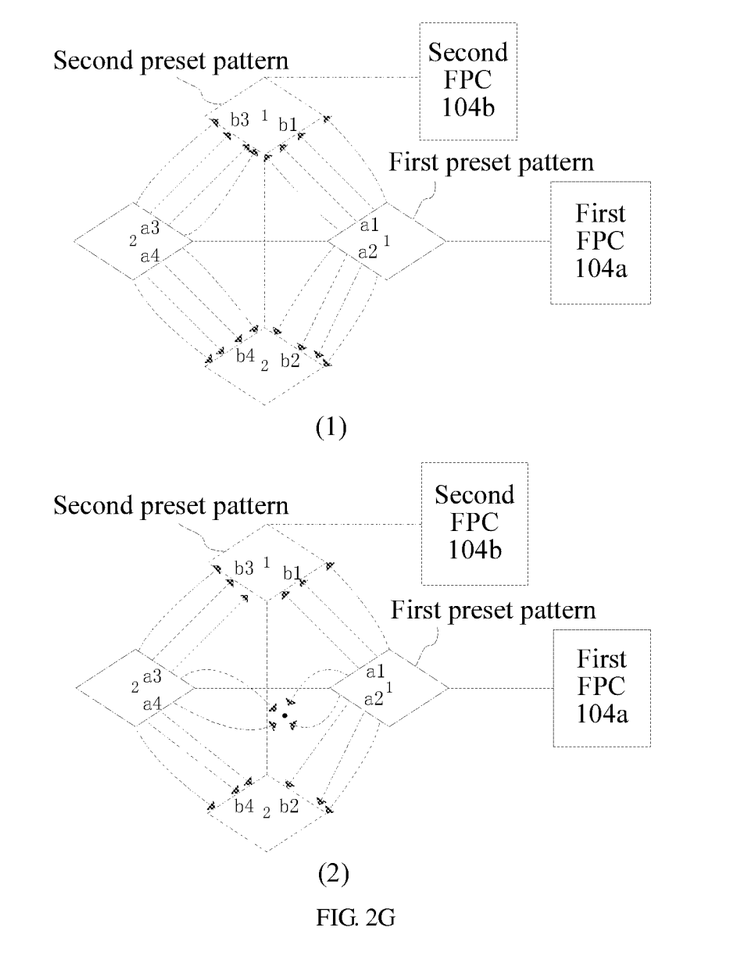
FIG. 2G is a schematic top view of current distribution for a touch operation according to an embodiment of the present invention.

During signal coupling, in this embodiment, a current signal is used as an example for detailed description. Refer to a schematic top view of current distribution for a touch operation shown in FIG. 2G. FIG. 2G (1) shows current distribution of a touch panel when there is no touch operation. When a current passes through a first preset pattern 1, a coupling capacitance is generated between an edge a1 on an upper left side of the first preset pattern 1 and an edge b1 on a lower right side of a second preset pattern 1, and all currents at the edge a1 are coupled to the edge b1. Similarly, all currents at an edge a2 on a lower left side of the first preset pattern 1 are coupled to an edge b2 on an upper right side of a second preset pattern 2. When a current passes through a first preset pattern 2, all currents at an edge a3 on an upper right side of the first preset pattern 2 are coupled to an edge b3 on a lower left side of the second preset pattern 1. Similarly, all currents at an edge a4 on a lower right side of the first preset pattern 2 are coupled to an edge b4 on an upper left side of the second preset pattern 2.

FIG. 2G (2) shows current distribution of a touch panel when there is a touch operation. When a current passes through a first preset pattern 1 and a touch operation exists in a surrounding preset region of the first preset pattern 1, a part of currents at an edge a1 on an upper left side of the first preset pattern 1 are shunted to a path formed by a human body and the ground, and remaining currents are coupled to an edge b1 on a lower right side of a second preset pattern 1. Similarly, a part of currents at an edge a2 on a lower left side of the first preset pattern 1 are shunted to the path formed by the human body and the ground, and remaining currents are coupled to an edge b2 on an upper right side of a second preset pattern 2. When a current passes through a first preset pattern 2 and a touch operation exists in a surrounding preset region of the first preset pattern 2, a part of currents at an edge a3 on an upper right side of the first preset pattern 2 are shunted to the path formed by the human body and the ground, and remaining currents are coupled to an edge b3 on a lower left side of the second preset pattern 1. Similarly, a part of currents at an edge a4 on a lower right side of the first preset pattern 2 are shunted to the path formed by the human body and the ground, and remaining currents are coupled to an edge b4 on an upper left side of the second preset pattern 2.

In conclusion, according to the touch panel provided by the embodiment of the present invention, one end of each row is connected to one end of a first metal wire, and the other end of the first metal wire is connected to a first FPC, so that a length of the first FPC included in an FPC in a second direction is determined by a distance between an endpoint at the other end of a $1^{st}$ first metal wire and an endpoint at the other end of an $n^{th}$ first metal wire, the length of the first FPC in the second direction can be reduced by shortening the distance, and consequently the length of the first FPC in the second direction is less than a perpendicular distance between a $1^{st}$ row and an $n^{th}$ row, thereby solving the problem in the prior art that a large area of the FPC, which is caused by the length of the first FPC in the second direction that is equal to the perpendicular distance between the $1^{st}$ row and the $n^{th}$ row, results in a high production cost of the touch panel, and achieving the effect of reducing the production cost of the touch panel. In addition, by enabling a row width to be equal to a column width, a balance is achieved between a self-capacitance generated between a first conductive pattern and the ground and a coupling capacitance generated between the first conductive pattern and a second conductive pattern, so that time of responding to a touch operation can be shortened, and accuracy and sensitivity of responding to the touch operation can be improved.

Figure 3:
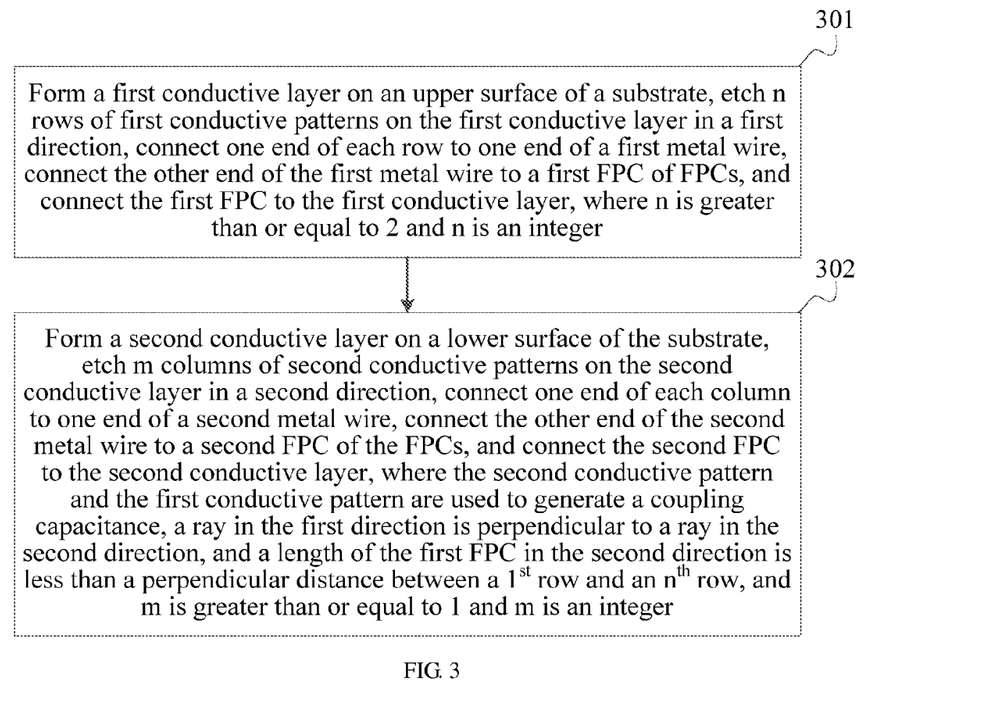
FIG. 3 is a method flowchart of a touch panel production method according to an embodiment of the present invention.

Referring to FIG. 3, FIG. 3 shows a method flowchart of a touch panel production method according to an embodiment of the present invention. The touch panel production method may include:

Step 301: Form a first conductive layer on an upper surface of a substrate, etch n rows of first conductive patterns on the first conductive layer in a first direction, connect one end of each row to one end of a first metal wire, connect the other end of the first metal wire to a first FPC of FPCs, and connect the first FPC to the first conductive layer, where n is greater than or equal to 2 and n is an integer.

Step 302: Form a second conductive layer on a lower surface of the substrate, etch m columns of second conductive patterns on the second conductive layer in a second direction, connect one end of each column to one end of a second metal wire, connect the other end of the second metal wire to a second FPC of the FPCs, and connect the second FPC to the second conductive layer, where m is greater than or equal to 1 and m is an integer.

The second conductive pattern and the first conductive pattern are used to generate a coupling capacitance.

A ray in the first direction is perpendicular to a ray in the second direction, and a length of the first FPC in the second direction is less than a perpendicular distance between a 1st row and an $n^{th}$ row.

In conclusion, according to the method provided by the embodiment of the present invention, one end of each row is connected to one end of a first metal wire, and the other end of the first metal wire is connected to a first FPC of FPCs, so that a length of the first FPC included in the FPC in a second direction is determined by a distance between an endpoint at the other end of a $1^{st}$ first metal wire and an endpoint at the other end of an $n^{th}$ first metal wire, the length of the first FPC in the second direction can be reduced by shortening the distance, and consequently the length of the first FPC in the second direction is less than a perpendicular distance between a $1^{st}$ row and an $n^{th}$ row, thereby solving the problem in the prior art that a large area of the FPC, which is caused by the length of the first FPC in the second direction that is equal to the perpendicular distance between the $1^{st}$ row and the $n^{th}$ row, results in a high production cost of the touch panel, and achieving the effect of reducing the production cost of the touch panel.

Figure 4:
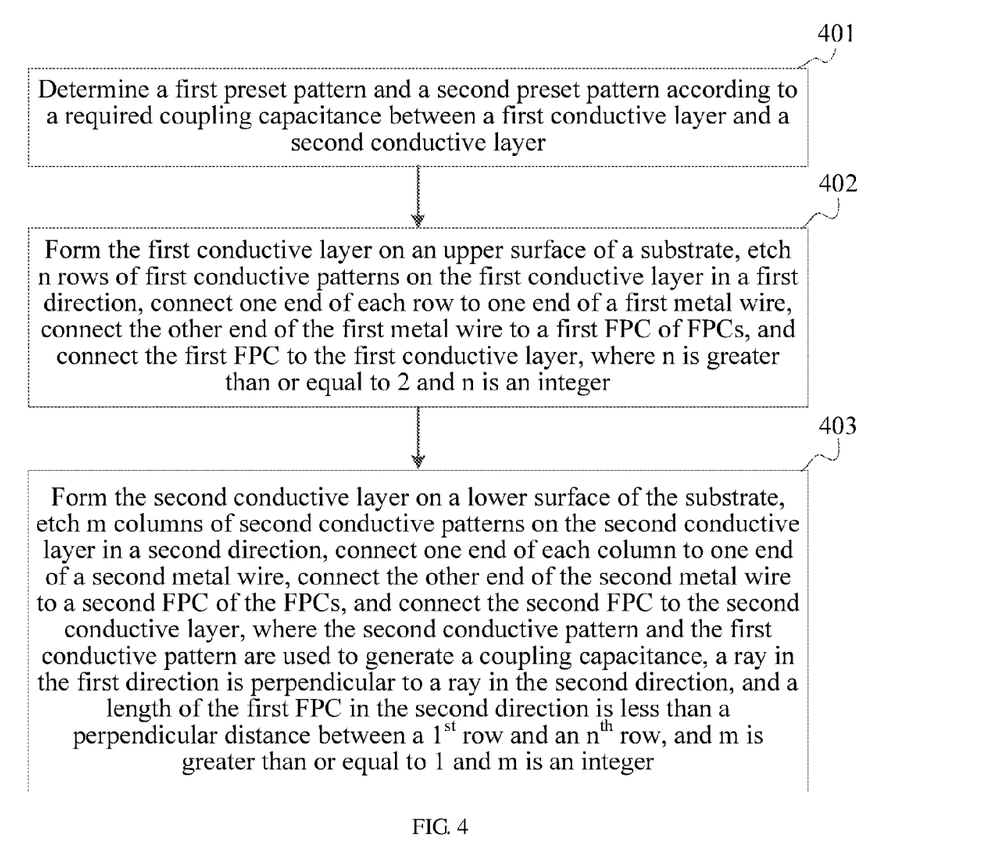
FIG. 4 is a method flowchart of a touch panel production method according to another embodiment of the present invention.

Referring to FIG. 4, FIG. 4 shows a method flowchart of a touch panel production method according to another embodiment of the present invention. The touch panel production method may include:

Step 401: Determine a first preset pattern and a second preset pattern according to a required coupling capacitance between a first conductive layer and a second conductive layer.

For a process of determining the first preset pattern and the second preset pattern according to the required coupling capacitance, reference may be made to the detailed description in the embodiment shown in FIG. 2A, which is not described herein again.

Step 402: Form the first conductive layer on an upper surface of a substrate, etch n rows of first conductive patterns on the first conductive layer in a first direction, connect one end of each row to one end of a first metal wire, connect the other end of the first metal wire to a first FPC of FPCs, and connect the first FPC to the first conductive layer, where n is greater than or equal to 2 and n is an integer.

A process of producing the first conductive layer includes the following steps:

1) Attach a conductive material such as ITO to the upper surface of the substrate by using a process such as film coating, so as to form the first conductive layer.

2) Etch the determined first preset pattern in a manner of photolithography, printing acid-resistant ink, or the like, so as to form the n rows of first conductive patterns.

3) Coat the first conductive pattern with a protective layer, and expose an edge which is on the upper surface and needs to be deployed with first metal wires.

4) If the first metal wires are silver paste, form the first metal wires at the exposed edge by using a process such as printing; and if the first metal wires are molybdenum-aluminum-molybdenum, form the first metal wires at the exposed edge by using a process such as photolithography.

5) Connect the first FPC to the edge at which the first metal wires are located, so as to connect to the first metal wires.

Step 403: Form the second conductive layer on a lower surface of the substrate, etch m columns of second conductive patterns on the second conductive layer in a second direction, connect one end of each column to one end of a second metal wire, connect the other end of the second metal wire to a second FPC of the FPCs, and connect the second FPC to the second conductive layer, where the second conductive pattern and the first conductive pattern are used to generate a coupling capacitance, and m is greater than or equal to 1 and m is an integer.

A process of producing the second conductive layer includes the following steps.

1) Attach a conductive material such as ITO to the upper surface of the substrate by using a process such as film coating, so as to form the second conductive layer.

2) Etch the determined second preset pattern in a manner of photolithography, printing acid-resistant ink, or the like, so as to form the n columns of second conductive patterns.

3) Coat the second conductive pattern with a protective layer, and expose an edge which is on the lower surface and needs to be deployed with second metal wires.

4) If the second metal wires are silver paste, form the second metal wires at the exposed edge by using a process such as printing; and if the second metal wires are molybdenum-aluminum-molybdenum, form the second metal wires at the exposed edge by using a process such as photolithography.

5) Connect the second FPC to the edge at which the second metal wires are located, so as to connect to the second metal wires.

It needs to be added that, before the second conductive layer is produced, the first conductive layer further needs to be coated with a protective layer, so as to protect the first conductive layer when the second conductive layer is produced.

A ray in the first direction is perpendicular to a ray in the second direction, and a length of the first FPC in the second direction is less than a perpendicular distance between a $1^{st}$ row and an $n^{th}$ row.

For ease of description, the "length in the second direction" in the following is abbreviated as the "length".

In this embodiment, before the first FPC is connected, the length of the first FPC further needs to be determined. Because the first FPC is connected to first metal wires, the length of the first FPC is determined by a distance between an endpoint at the other end of a $1^{st}$ first metal wire and a port at the other end of an $n^{th}$ first metal wire. The length of the first FPC is reduced by shortening the distance, so that an area of the FPC can be reduced, thereby reducing a production cost of the touch panel. Similarly, a length of the second FPC is also determined by a distance between an endpoint at the other end of a $1^{st}$ second metal wire and a port at the other end of an $m^{th}$ second metal wire.

After the length of the first FPC is determined according to the first metal wires and the length of the second FPC is determined according to the second metal wires, the first FPC may be set to be directly opposite to the second FPC. Being directly opposite means that a projection region, of a connection region of the first FPC on the first conductive layer, on the second conductive layer, overlaps with a connection region of the second FPC on the second conductive layer, that is, the projection region includes or is equal to the connection region. For example, the first FPC is connected to a right edge of the first conductive layer, and the second FPC is connected to a corresponding position at a right edge of the second conductive layer.

Because a projection, of the first metal wire connected to each row of first conductive pattern, on the second conductive layer does not intersect with the second metal wire connected to each column of second conductive pattern, if the first FPC is directly opposite to the second FPC, the length of the first FPC is greater than or equal to a sum of a perpendicular distance between the $1^{st}$ first metal wire and the $n^{th}$ first metal wire on the first conductive layer and a perpendicular distance between the $1^{st}$ second metal wire and the $m^{th}$ second metal wire on the second conductive layer. Preferably, in order to further reduce the length of the FPC, the first FPC may further be set to be not directly opposite to the second FPC. In this case, the length of the first FPC is equal to the perpendicular distance between the $1^{st}$ first metal wire and the $n^{th}$ first metal wire.

It needs to be added that, ports of all rows of first conductive patterns, which are on a same side, may be separately connected to the first FPC; ports of all rows of first conductive patterns, which are on different sides, may also be separately connected to the first FPC; and a right-side port and a left-side port of a first conductive pattern may further be separately connected to the first FPC. The right-side port of the first conductive pattern is a right-side port of a first preset pattern arranged on the rightmost side, and the left-side port of the first conductive pattern is a left-side port of a first preset pattern arranged on the leftmost side.

In this embodiment, the first metal wires may be etched on a port of the first conductive pattern according to a connection manner. Similarly, second metal wires may be etched on a port of the second conductive pattern according to a connection manner.

The method further includes, if the first conductive pattern is formed by at least two first preset patterns, connecting adjacent first preset patterns in a row; and if the second conductive pattern is formed by at least two second preset patterns, connecting adjacent second preset patterns in a column.

If each row of first conductive pattern is formed by at least two first preset patterns, when the first conductive patterns are etched, a connection line between adjacent first preset patterns in each row of first conductive pattern further needs to be etched. The connection line may be a conductive rectangle connection block, a conductive wire, or the like. Similarly, a connection line between adjacent second preset patterns in each column of second conductive pattern needs to be etched.

Before the etching n rows of first conductive patterns on the first conductive layer in a first direction, the method further includes setting a same row width for each row, and setting a same column width for each column, where the column width is equal to the row width.

In this embodiment, a row width of a row in which a first conductive pattern is located and a column width of a column in which a second conductive pattern is located may further be set. The row width of each row may be equal, and the column width of each column may be equal. The row width of each row may further be set to a first numeric value, and the column width of each column may be set to a second numeric value. When the first conductive pattern is different from the second conductive pattern, the first numeric value and the second numeric value may further be set to further determine a relationship between the row width and the column width.

For example, if the second numeric value is set to be less than the first numeric value, the row width is greater than the column width; or if the second numeric value is set to be greater than the first numeric value, the row width is less than the column width; or if the second numeric value is set to be equal to the first numeric value, the row width is equal to the column width. When the row width is equal to the column width, a balance is achieved between a self-capacitance generated between one row of first conductive pattern and the ground and a coupling capacitance generated between the row of first conductive pattern and each column of second conductive pattern, so that time of responding to a touch operation can be shortened, and accuracy and sensitivity of responding to the touch operation can be improved.

After the first numeric value is determined, each row of first conductive pattern with the row width being the first numeric value is etched, and after the second numeric value is determined, each column of second conductive pattern with the column width being the second numeric value is etched.

The method further includes connecting a touch control chip and a peripheral circuit to each of the first FPC and the second FPC.

The touch control chip is used to detect a touch operation and includes a drive pin and a receiving pin, where the drive pin is used to send a drive signal, and the receiving pin is used to receive a received signal that is fed back according to the drive signal. The peripheral circuit is used to connect the touch control chip to the FPC or an external element. The touch control chip and the peripheral circuit may be located in the FPC. Alternatively, in order to further reduce the area of the FPC, the touch control chip and the peripheral circuit may further be deployed in on main board, and the FPC may interact with the touch control chip by using a connection between the FPC and the main board.

The method further includes connecting the first FPC to the drive pin of the touch control chip, and connecting the second FPC to the receiving pin of the touch control chip; or connecting the first FPC to the receiving pin of the touch control chip, and connecting the second FPC to the drive pin of the touch control chip.

The drive pin is used to send a drive signal, and the receiving pin is used to receive a received signal that is fed back according to the drive signal.

In this embodiment, locations of the first FPC and the touch control chip on the touch panel may further be determined in advance, and metal wires are etched in these locations, so as to connect the first FPC to the drive pin of the touch control chip by using the etched metal wires. Similarly, the second FPC is connected to the receiving pin of the touch control chip by using the etched metal wires. Alternatively, the first FPC is connected to the receiving pin of the touch control chip by using the etched metal wires, and similarly, the second FPC is connected to the drive pin of the touch control chip by using the etched metal wires.

In conclusion, according to the method provided by the embodiment of the present invention, one end of each row is connected to one end of a first metal wire, and the other end of the first metal wire is connected to a first FPC of FPCs, so that a length of the first FPC included in the FPC in a second direction is determined by a distance between an endpoint at the other end of a $1^{st}$ first metal wire and an endpoint at the other end of an $n^{th}$ first metal wire, the length of the first FPC in the second direction can be reduced by shortening the distance, and consequently the length of the first FPC in the second direction is less than a perpendicular distance between a $1^{st}$ row and an $n^{th}$ row, thereby solving the problem in the prior art that a large area of the FPC, which is caused by the length of the first FPC in the second direction that is equal to the perpendicular distance between the $1^{st}$ row and the $n^{th}$ row, results in a high production cost of the touch panel, and achieving the effect of reducing the production cost of the touch panel. In addition, by setting a same row width for each row and setting a same column width for each column, where the column width is equal to the row width, a balance is achieved between a self-capacitance generated between a first conductive pattern and the ground and a coupling capacitance generated between the first conductive pattern and a second conductive pattern, so that time of responding to a touch operation can be shortened, and accuracy and sensitivity of responding to the touch operation can be improved.

The sequence numbers of the foregoing embodiments of the present invention are merely for the purpose of description, and do not represent superiority or inferiority of the embodiments.

A person of ordinary skill in the art may understand that all or a part of the steps of the embodiments may be implemented by hardware or a program instructing relevant hardware. The program may be stored in a computer readable storage medium. The storage medium may be a read-only memory, a magnetic disk, or an optical disc.

The foregoing descriptions are merely exemplary embodiments of the present invention, but are not intended to limit the present invention. Any modification, equivalent replacement, and improvement made without departing from the principle of the present invention shall fall within the protection scope of the present invention.

What is claimed is:

1. A touch panel, wherein the touch panel comprises:
    a substrate;
    a first conductive layer formed on an upper surface of the substrate;
    a second conductive layer formed on a lower surface of the substrate; and
    a plurality of flexible printed circuits (FPCs),
    wherein the FPCs comprise a first FPC and a second FPC,
    wherein the first FPC is connected to the first conductive layer, and
    wherein the second FPC is connected to the second conductive layer,
    wherein the first conductive layer comprises N rows of first conductive patterns that are arranged in a first direction,
    wherein one end of the first conductive pattern on each row is connected to one end of a first metal wire,
    wherein the other end of the first metal wire is connected to the first FPC such that N first metal wires are directly connected to the first FPC,
    wherein the second conductive layer comprises M columns of second conductive patterns that are arranged in a second direction,
    wherein one end of the second conductive pattern on each column is connected to one end of a second metal wire,
    wherein the other end of the second metal wire is connected to the second FPC such that M second metal wires are directly connected to the second FPC,
    wherein the second conductive pattern on each column and the first conductive pattern on each row are used to generate a coupling capacitance,
    wherein a ray in the first direction is perpendicular to a ray in the second direction, and
    wherein a length of the first FPC in the second direction is less than a perpendicular distance between a $1^{st}$ row and an $n^{th}$ row.

2. The touch panel according to claim 1, wherein adjacent first preset patterns in a row are connected when the first conductive pattern comprises at least two first preset patterns, and wherein adjacent second preset patterns in a column are connected when the second conductive pattern comprises at least two second preset patterns.

3. The touch panel according to claim 2, wherein the first preset patterns and the second preset patterns are determined by a required coupling capacitance between the first conductive layer and the second conductive layer.

4. The touch panel according to claim 1, wherein a row width of each row is equal, wherein a column width of each column is equal, and wherein the row width is equal to the column width.

5. The touch panel according to claim 1, wherein the touch panel further comprises a touch control chip and a peripheral circuit that are connected to each of the first FPC and the second FPC.

6. The touch panel according to claim 5, wherein the first FPC is connected to a drive pin of the touch control chip, and wherein the second FPC is connected to a receiving pin of the touch control chip.

7. The touch panel according to claim 5, wherein the first FPC is connected to a receiving pin of the touch control chip, wherein the second FPC is connected to a drive pin of the touch control chip, wherein the drive pin is used to send a drive signal, and wherein the receiving pin is used to receive a received signal that is fed back according to the drive signal.

8. A touch panel production method, wherein the method comprises:
forming a first conductive layer on an upper surface of a substrate;
etching N rows of first conductive patterns on the first conductive layer in a first direction;
connecting one end of each row to one end of a first metal wire such that N first metal wires are directly connected to a first flexible printed circuit (FPC) of a plurality of FPCs;
connecting the other end of the first metal wire to the first FPC of the FPCs;
connecting the first FPC to the first conductive layer;
forming a second conductive layer on a lower surface of the substrate;
etching M columns of second conductive patterns on the second conductive layer in a second direction;
connecting one end of each column to one end of a second metal wire;
connecting the other end of the second metal wire to a second FPC of the FPCs such that M second metal wires are directly connected to the second FPC; and
connecting the second FPC to the second conductive layer,
wherein the second conductive pattern and the first conductive pattern are used to generate a coupling capacitance,
wherein a ray in the first direction is perpendicular to a ray in the second direction, and
wherein a length of the first FPC in the second direction is less than a perpendicular distance between a $1^{st}$ row and an $n^{th}$ row.

9. The touch panel production method according to claim 8, wherein the method further comprises:
connecting adjacent first preset patterns in a row when the first conductive pattern is formed by at least two first preset patterns; and
connecting adjacent second preset patterns in a column when the second conductive pattern is formed by at least two second preset patterns.

10. The touch panel production method according to claim 9, wherein before etching the n rows of the first conductive patterns on the first conductive layer in the first direction, the method further comprises determining the first preset patterns and the second preset patterns according to a required coupling capacitance between the first conductive layer and the second conductive layer.

11. The touch panel production method according to claim 8, wherein before etching the n rows of the first conductive patterns on the first conductive layer in the first direction, the method further comprises:
setting a same row width for each row; and
setting a same column width for each column, and
wherein the column width is equal to the row width.

12. The touch panel production method according to claim 8, wherein the method further comprises connecting a touch control chip and a peripheral circuit to each of the first FPC and the second FPC.

13. The touch panel production method according to claim 12, wherein the method further comprises:
connecting the first FPC to a drive pin of the touch control chip; and
connecting the second FPC to a receiving pin of the touch control chip.

14. The touch panel production method according to claim 12, wherein the method further comprises:
connecting the first FPC to a receiving pin of the touch control chip; and
connecting the second FPC to a drive pin of the touch control chip,
wherein the drive pin is used to send a drive signal, and
wherein the receiving pin is used to receive a received signal that is fed back according to the drive signal.

15. An apparatus, comprising:
a substrate;
a first conductive layer formed on an upper surface of the substrate;
a second conductive layer formed on a lower surface of the substrate; and
a plurality of flexible printed circuits (FPCs),
wherein the FPCs comprise a first FPC and a second FPC,
wherein the first FPC is connected to the first conductive layer, and
wherein the second FPC is connected to the second conductive layer,
wherein the first conductive layer comprises N rows of first conductive patterns that are arranged in a first direction,
wherein the first conductive pattern on each row is directly connected to the first FPC via N first metal wires,
wherein the second conductive layer comprises M columns of second conductive patterns that are arranged in a second direction,
wherein the second conductive pattern on each column is directly connected to the second FPC via M second metal wires,
wherein the second conductive pattern on each column and the first conductive pattern on each row are used to generate a coupling capacitance,
wherein a ray in the first direction is perpendicular to a ray in the second direction, and
wherein a length of the first FPC in the second direction is less than a perpendicular distance between a $1^{st}$ row and an $n^{th}$ row.

16. The apparatus of claim 15, wherein a row width of each row is equal, wherein a column width of each column is equal, and wherein the row width is equal to the column width.

17. The apparatus of claim 15, wherein adjacent first preset patterns in a row are connected when the first conductive pattern comprises at least two first preset patterns.

18. The apparatus of claim 15, wherein adjacent second preset patterns in a column are connected when the second conductive pattern comprises at least two second preset patterns.

19. The apparatus of claim 15, wherein the touch panel further comprises a touch control chip and a peripheral circuit that are connected to each of the first FPC and the second FPC.

20. The apparatus of claim 15, wherein the length of the first FPC in the second direction is determined by a distance between an endpoint at one end of a first one of the first metal wires and an endpoint at another of an $N^{th}$ one of the first metal wires.

* * * * *